(12) United States Patent
Zeeshan et al.

(10) Patent No.: US 11,956,978 B2
(45) Date of Patent: Apr. 9, 2024

(54) TECHNIQUES AND DEVICE STRUCTURE BASED UPON DIRECTIONAL SEEDING AND SELECTIVE DEPOSITION

(71) Applicant: Applied Materials, Inc., Santa Clara, CA (US)

(72) Inventors: M. Arif Zeeshan, Manchester, MA (US); Kelvin Chan, San Ramon, CA (US); Shantanu Kallakuri, Ithaca, NY (US); Sony Varghese, Manchester, MA (US)

(73) Assignee: Applied Materials, Inc., Santa Clara, CA (US)

( * ) Notice: Subject to any disclaimer, the term of this patent is extended or adjusted under 35 U.S.C. 154(b) by 446 days.

(21) Appl. No.: 17/011,729

(22) Filed: Sep. 3, 2020

(65) Prior Publication Data
US 2022/0068923 A1 Mar. 3, 2022

(51) Int. Cl.
| | |
|---|---|
| *C23C 16/04* | (2006.01) |
| *C23C 14/22* | (2006.01) |
| *C23C 16/02* | (2006.01) |
| *C23C 16/455* | (2006.01) |
| *H10B 99/00* | (2023.01) |
| *H01L 21/285* | (2006.01) |

(52) U.S. Cl.
CPC ......... *H10B 99/00* (2023.02); *C23C 16/0281* (2013.01); *C23C 16/047* (2013.01); *C23C 14/221* (2013.01); *C23C 14/225* (2013.01); *C23C 16/0209* (2013.01); *C23C 16/45525* (2013.01); *H01L 21/28562* (2013.01)

(58) Field of Classification Search
None
See application file for complete search history.

(56) References Cited

U.S. PATENT DOCUMENTS

| | | | |
|---|---|---|---|
| 2016/0005607 A1* | 1/2016 | Russell | H01L 21/0217 438/791 |
| 2019/0181047 A1* | 6/2019 | Sung | H01L 29/7851 |
| 2019/0181144 A1* | 6/2019 | Varghese | H01L 27/10855 |
| 2020/0027733 A1* | 1/2020 | Hautala | H05K 3/022 |

* cited by examiner

*Primary Examiner* — Jose I Hernandez-Kenney
(74) *Attorney, Agent, or Firm* — KDW Firm PLLC (57) ABSTRACT

In one embodiment, a method of selectively forming a deposit may include providing a substrate, the substrate having a plurality of surface features, extending at a non-zero angle of inclination with respect to a perpendicular to a plane of the substrate. The method may include directing a reactive beam to the plurality of surface features, the reactive beam defining a non-zero angle of incidence with respect to a perpendicular to the plane of the substrate, wherein a seed layer is deposited on a first portion of the surface features, and is not deposited on a second portion of the surface features. The method may further include exposing the substrate to a reactive deposition process after the directing the reactive ion beam, wherein a deposit layer selectively grows over the seed layer.

13 Claims, 7 Drawing Sheets

TECHNIQUES AND DEVICE STRUCTURE BASED UPON DIRECTIONAL SEEDING AND SELECTIVE DEPOSITION

FIELD

The present embodiments relate to semiconductor device structures, and more particularly, to structures and processing for memory devices including dynamic random access devices.

BACKGROUND

Present day semiconductor devices are characterized by three-dimensional structures, where the dimensions of individual structures and spacings between structures continues to shrink. This scaling to smaller dimensions causes many challenges, including the ability to process regions between structures, including filling regions between adjacent structures. Notably, patterning or forming layers on select portion of three dimensional structures also becomes more challenging, entailing complex processing, including lithography and other operations.

For example, placement of a layer just on the top of a fin structure may be difficult using known chemical vapor deposition approaches. Additionally, directional physical deposition processes may tend to accumulate material non-uniformly on different portions of a fin structure, leading to non-uniform thickness, "bread-loafing", or other non-ideal shapes.

With respect to these and other considerations, the present disclosure is provided.

BRIEF SUMMARY

In one embodiment, a method of selectively forming a deposit may include providing a substrate, the substrate having a plurality of surface features, extending at a non-zero angle of inclination with respect to a perpendicular to a plane of the substrate. The method may include directing a reactive beam to the plurality of surface features, the reactive beam defining a non-zero angle of incidence with respect to a perpendicular to the plane of the substrate, wherein a seed layer is deposited on a first portion of the surface features, and is not deposited on a second portion of the surface features. The method may further include exposing the substrate to a reactive deposition process after the directing the reactive ion beam, wherein a deposit layer selectively grows over the seed layer.

In another embodiment, a method of forming a multi-level device contact, may include providing a substrate, the substrate defining a plane of the substrate and having an array of spacer features, disposed over an array of active device features, arranged in a first level. The method may include directing a reactive beam to the array of spacer features, the reactive beam defining a non-zero angle of incidence with respect to a perpendicular to the plane of the substrate, where the reactive beam comprises a metallic species. As such, a seed layer may be deposited on a first portion of the array of spacer features, and not deposited on a second portion of the array of spacer features, wherein the seed layer forms an array of staggered contacts, having an S-shape.

In another embodiment, an electronic device is provided, including an active device region, disposed at least partially in a first level, the active device region comprising an array of active device features. The electronic device may also include an array of device structures, disposed in a second level, above the first level, and a contact level, comprising an array of staggered contacts, where the array of staggered contacts electrically connect the array of active device features to the array of device structures.

DETAILED DESCRIPTION

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

The present embodiments provide novel techniques and substrate structures to form devices, such as electronic devices, where selective formation of a layer on a three-dimensional surface is an integral part of device fabrication. In particular examples, a metallic or conductive layer is selectively formed on a portion of a device having a three dimensional surface.

According to some embodiments, the techniques disclosed herein may be applicable to formation of memory devices, such as DRAM devices, while other devices may also be formed according to various embodiments of the disclosure. These other devices may include NAND devices, including 3DNAND devices, NOR devices, X point memories and logic devices, as well as packaging structures, where a common feature is the linking of different components in different levels of a given device using a staggered structure, such as a staggered contact.

Figure 1A:
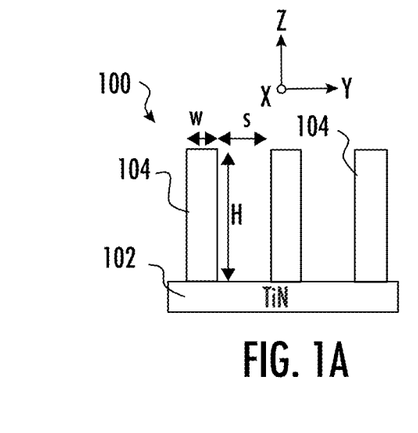
FIG. 1A shows a side view of a device structure at a first instance before processing.

Turning now to the figures, FIG. 1A shows a side view of a device structure at a first instance before processing for selectively forming a deposit layer. The substrate 100 may include various layers or components not shown. In this instance, the device structure includes a base layer 102, as well as surface features 104, extending above the base layer 102. In some embodiments, the base layer 102 may be the same material as the material of surface features 104, while in other embodiments, the base layer 102 may differ from the material of surface features 104. For example, the base layer 102 may be a silicon layer, while the surface features are silicon fins forming part of a fin-type field effect transistor (finFET). In some examples, the base layer 102 may be an oxide, nitride, semiconductor, or metal, while the surface features are a different material than the base layer, including an oxide, nitride, semiconductor, or metal. The embodiments are not limited in this context.

Figure 1B:
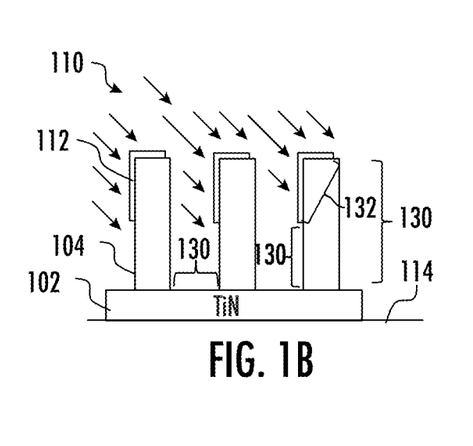
FIG. 1B shows a side view of the device structure of FIG. 1A at a second instance during a processing for selectively forming a deposit layer.
Figure 1C:
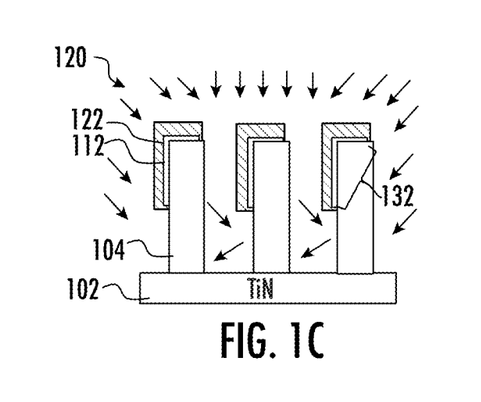
FIG. 1C shows a side view of the device structure of FIG. 1B at a third instance during a processing for selectively forming a deposit layer.

According to embodiments of the disclosure, the device structure of FIG. 1A provides a suitable template for selective formation of a deposit layer, as detailed with respect to FIGS. 1B and 1C. Notably, the surface features 104 are characterized by a height H, a width W, and a spacing S. In some non-limiting embodiments, these dimensions may be uniform across a device or substrate, while in other embodiments, the height, width, and spacing may vary. Notably, while just three surface features are shown, these features may represent a large number of features in various embodiments, having individual dimensions on the order of micrometers, or nanometers, and arranged in arrays having the lateral dimensions on the order of millimeters and centimeters.

FIG. 1B shows a side view of the device structure of FIG. 1A at a second instance during processing. At this instance a reactive beam 110, shown as a plurality of arrows, is directed the surface features 104, to form a seed layer 112. The reactive beam 110 may include any combination of radicals, neutrals, reactive neutrals, and ions in various embodiments of the disclosure. As shown in FIG. 1B, the seed layer 112 is deposited on a first portion 132 of the surface features 104, and is not deposited on a second portion 130 of the surface features 104. Note that in this example, the second portion 130 of surface features 104 may be deemed to include surfaces of base layer 102 extending between adjacent surface features 104. As further depicted in FIG. 1B, the trajectory of depositing species in the reactive beam 110 may be such that the reactive beam 110 defines a non-zero angle of incidence with respect to a perpendicular to a plane of the substrate 100, where this geometry is further detailed with respect to FIG. 5. Because the reactive beam 110 is directed at a non-zero angle of incidence, certain parts of the surface features 104 intercept the reactive beam 110, while other parts are shadowed from receiving the reactive beam 110.

As noted above, in accordance with embodiments of the disclosure, the reactive beam 110 may include reactive species such as radicals, reactive ions and other species, where the reactive species may condense upon surfaces of the surface features 104 that intercept the ions. Exemplary reactive species for reactive beam 110 may include known chemistries suitable for plasma enhanced chemical vapor deposition (PECVD), chemical vapor deposition process, reactive ion beam deposition, and similar processes. The composition of species used to form the reactive beam 110 may be chosen according to the targeted material to be deposited as the seed layer 112. Generally, the material of seed layer 112 may be a metal, an insulator, or a semiconductor according to different embodiments of the disclosure.

Examples of suitable chemistry for depositing a seed layer of silicon include $SiH_4$ (silane)/$H_2$ in one non-limiting embodiment. However, other known chemistries for reactively depositing silicon may be employed as will be appreciated by one of ordinary skill in the art. Examples of suitable chemistry for depositing a seed layer of silicon dioxide include $SiH_4/O_2$ in one non-limiting embodiment. However, other known chemistries for reactively depositing silicon dioxide may be employed as will be appreciated by one of ordinary skill in the art. Examples of suitable chemistry for depositing a seed layer of silicon nitride include $SiH_4/NH_3$ or $SiH_4$ (silane)/$N_2$ in two embodiments. However, other known chemistries for reactively depositing silicon nitride may be employed as will be appreciated by one of ordinary skill in the art. Other examples for depositing metals include known reactive chemistries for depositing tungsten metal, copper metal, and so forth.

The reactive beam 110 may be generated by any suitable reactive source, where examples are detailed with respect to FIGS. 2-5 to follow. In various embodiments, the reactive beam 110 may be created from a suitable ion source, such as a plasma enhanced chemical vapor deposition (PECVD) source.

According to some embodiments, the reactive beam 110 may be directed to the substrate 100 at a non-zero angle of incidence between 5 degrees and 85 degrees, where the exact angle of incidence is tailored according to the portion of the surface features 104 to be coated by the seed layer 112. In various embodiments of a reactive beam created from a PECVD source, the reactive beam 110 may be generated of species that condense on a wide variety of substrates having different surface compositions, such as oxides, nitrides, silicon, metal, and so forth, with little or no chemical selectivity. As such, species of reactive beam 110 may condense on a substrate surface generally at or near the point of the substrate that is impacted by the species.

In various non-limiting embodiments, the seed layer 112 may be deposited to a thickness between 1 nm and 10 nm, and in particular embodiments at a thickness of between 2 nm and 4 nm. For tight CD features, where the pitch may be on the order of 20 nm-30 nm or less, and a 10 nm thick seed will fill the whole gap between adjacent surface features. Thus, the thickness of the seed layer 112 needs to be substantially less than the gap between adjacent features, so that for a 30 nm pitch with 15 nm gap, a seed layer thickness of 2 nm-4 nm may be appropriate, while for a 60 nm pitch with 30 nm gap, a seed layer thickness of 5 nm to 8 nm may be possible.

As suggested in FIG. 1B, the species of reactive beam 110 may exhibit directionality where the species are at least partially collimated so as to define a general non-zero angle of incidence with respect to a perpendicular to a plane of the substrate 100. In embodiments where the reactive beam 110 is derived from a PECVD plasma, condensation of the seed layer 112 may be promoted by a combination of heating of the substrate 100, as well as reactivity and/or kinetic energy of plasma-generated species. Generally, the seeding process generated by the reactive beam 110 may be specific to the exact chemistry and the overall process parameters. Generally, thermally-driven processes are selective and the surface reactions are promoted by increased substrate temperature and the selective nature of the precursors used to form the reactive beam 110. In the PECVD embodiments, the plasma based nature of the process reduces the need for high temperature as in straight CVD processes, in order to decompose the precursor at the surface.

Moreover, according to additional non-limiting embodiments, in embodiments where the reactive beam 110 includes reactive ions, the ion energy of ions in the reactive beam 110 may be between 10 eV and 100 eV. Various considerations for determining a suitable ion energy include that the ion energy should be sufficient to impart directionality to the reactive beam 110, and sufficient energy to facilitate reaction of the species of the reactive beam 110 to condense upon the substrate 100, as well as an energy below the energy range where sputtering becomes unduly common. For example, at energies of 500 eV, or 1000 eV, any ions in the reactive beam 110 may cause sputtering of portions of the surface features 104, as well as self re-sputtering of material condensing to form the seed layer 112, such that the seed layer 112 may be recondensed in areas not directly impacted by the reactive beam 110, leading to loss of selective placement of the seed layer 112.

In accordance with additional embodiments of the disclosure, the substrate 100 may be heated to generate a substrate temperature between 100 C and 1000 C, and in particular embodiments, between 100 C and 400 C, during the directing of the reactive beam 110. For example, in the case of deposition of tungsten on substrates such as silicon oxide, silicon nitride, silicon, or titanium nitride, to name a few non-limiting examples, a substrate temperature of 200 C has been found to be suitable to condense a tungsten seed layer. While higher substrate temperatures such as 400 C or 600 C may also be effective to condense a tungsten layer, for temperatures in excess of 600 C or so, practical considerations such as substrate clamping and avoiding undue substrate reactions may come into play. Of course, the exact temperature range for condensing a layer from a reactive beam will vary according to material to be deposited. For example, high substrate temperature, such as 1000 C, may be in order to reactively condense a seed layer of TiN, in which circumstance, a high temperature substrate holder may be used to hold the substrate 100.

Turning now to FIG. 1C there is shown a side view of the device structure of FIG. 1B at a subsequent instance during processing for selectively forming a deposit layer. In this instance, an operation is performed of exposing the substrate 100 to a reactive deposition process after seed layer 112 of FIG. 1B has already been grown. As such, a deposit layer 122 selectively grows over the seed layer 112, forming a selective deposit that grows in the first portion 132 and not in the second portion 130 of the surface features 104. The reactive deposition process may be a chemical vapor deposition (CVD) process or an atomic layer deposition (ALD) process in some non-limiting embodiments. In the example of FIG. 1C, condensing species 120 may be provided to the substrate in a non-directional or isotropic manner, at random trajectories, thus constituting a non-directional deposition process. The reactive deposition process may be designed based upon known chemistry where growth takes place on material of the seed layer 112 and does not take place on other surfaces of the surface features 104. As such, while condensing species 120 may impinge upon different surface of the surface features 104, the deposit layer 122 will grow just on the portion of surface features 104 initially covered by the seed layer 112.

In accordance with various embodiments of the disclosure the material of the seed layer 112 may be the same as the material of deposit layer 122 or may be a different material than the material of deposit layer 122. Salient criteria or properties of the material of the seed layer 112 include the ability to nucleate and selectively grow the material of deposit layer 122 given the chemistry of the CVD or ALD process used to grow the deposit layer. Selectively growing the deposit layer 122 on the seed layer 112 may in particular mean that the material of the deposit layer 122 is more readily grown on the surface of seed layer 112 with respect to material of the surface features 104 that is exposed at the surface of the second portion 130 of the surface features 104. Thus, for example, the material of seed layer 112 may be tungsten, where the material of deposit layer 122 is also tungsten, and the material of the exposed surface of the second portion 130 is silicon oxide. Thus, the ALD or CVD chemistry to grow the deposit layer 122 may be designed to nucleate and grow tungsten on tungsten surfaces and not on silicon oxide. Another example is where the seed layer 112 is silicon, the exposed surface of second portion 130 is silicon oxide, and the deposit layer is tungsten. In this example, the ALD or CVD chemistry is designed to selectively grow tungsten on silicon surfaces and not on silicon oxide. In another embodiment, the surface feature is silicon oxide (and therefore the surface of second portion 130 is also silicon oxide), the seed layer 112 may be silicon, and the deposit layer is ruthenium, where the ALD or CVD chemistry is arranged to selectively grow ruthenium on silicon surfaces as opposed to silicon oxide. The use of a different seed layer material than the deposit layer material may be advantageous in systems where production of a reactive beam of the deposit material may be difficult. For example, a practical PECVD processes for forming reactive Ru species to generate a reactive Ru beam does not exist, while CVD type processes for growing Ru on Si are known. Thus, by directionally depositing a reactive beam of silicon in the form of seed layer 112, a selective deposition of Ru can be readily accomplished by depositing Ru in a CVD process after the formation of a seed layer 112 of silicon, where the deposit layer 122 of Ruthenium just deposits on the seed layer 112 and not on the second portion 130.

In other embodiments, other combinations of seed layer 112 and deposit layer 122 are possible. Additionally, the deposit layer 122 may be an insulator such as an oxide or nitride. For example, the surface features may be silicon, while the seed layer 112 is silicon nitride and deposit layer is silicon nitride.

Figure 2A:
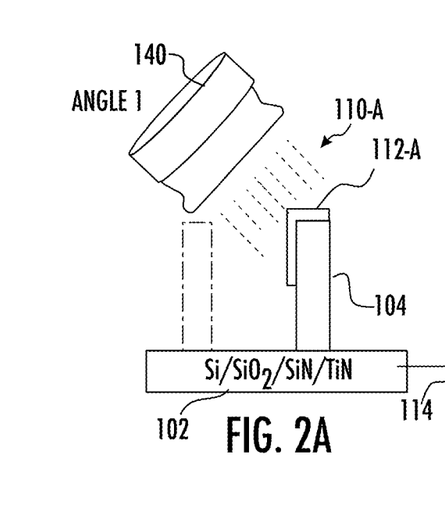
FIGS. 2A-2C show alternative configurations for reactive beam processing of a device structure according to embodiments of the disclosure.
Figure 2B:
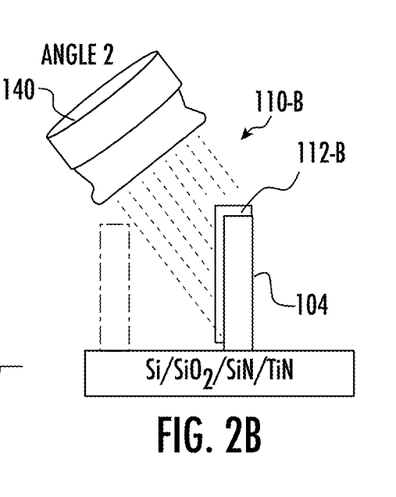
Figure 2C:
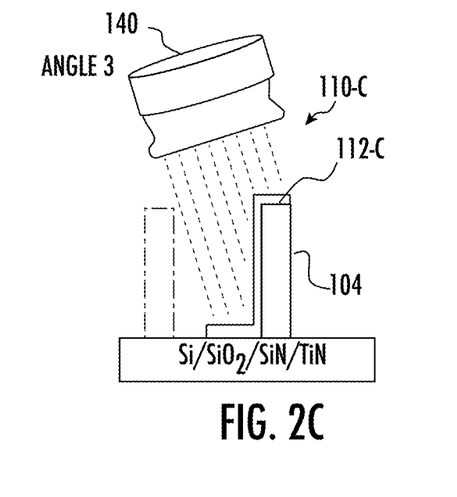

Turning to FIGS. 2A-2C there is shown a series of alternative configurations for reactive beam processing of a device structure according to embodiments of the disclosure. In FIG. 2A, a reactive source 140 is provided to direct a reactive beam 110-A to the substrate 100, as generally discussed above. The stage of processing corresponds to that stage shown in FIG. 1B, where a seed layer is selectively formed on the surface features 104, one of which feature is shown in FIG. 2A. Note that the configuration of FIGS. 2A-2C is predicated upon the fact that adjacent surface features (shown in dashed lines) will be present, such as a surface feature 104, immediately to the left of the surface feature 104, shown in the figures. As such, when the reactive beam 110-A is directed to the surface feature 104 at a first non-zero angle of incidence (angle 1), an entirety of a top surface of the surface feature 104 intercepts the reactive beam 110-A, causing a seed layer 112-A to form over the entire top surface, as well as a portion of the left sidewall of surface feature 104. At the angle 1 shown, shadowing by an adjacent surface feature causes the lower portion of the left sidewall of surface feature 104 to be blocked from the reactive beam 110-A, so that no seed layer forms on the lower portion.

In FIG. 2B, when a reactive beam 110-B is directed to the surface feature 104 at a second non-zero angle of incidence (angle 2), an entirety of a top surface of the surface feature 104 intercepts the reactive beam 110-B. In addition, because the angle2 is steeper, an entirety of the left sidewall of surface feature 104 is impacted by reactive beam 110-B, so that the seed layer 112-B forms on the entirety of the left sidewall and the top surface.

In FIG. 2C, when a reactive beam 110-C is directed to the surface feature 104 at a second non-zero angle of incidence (angle 3), an entirety of a top surface of the surface feature 104 intercepts the reactive beam 110-C. In addition, because the angle3 is still steeper, an entirety of the left sidewall of surface feature 104 is impacted by reactive beam 110-C, as well as a region of the surface feature 104 (or between surface features), corresponding to the upper surface of base layer 102. In this manner the seed layer 112-C forms on the entirety of the left sidewall and the top surface, as well as a region between adjacent surface features, forming an S-shaped or staggered deposit layer, meaning the seed layer 112-C generally exhibits an S-shaped cross-section. In this manner, the location of a deposit layer to be subsequently grown on a seed layer may be tailored by varying the angle of incidence of the ion beam used to form a seed layer.

Figure 3A:
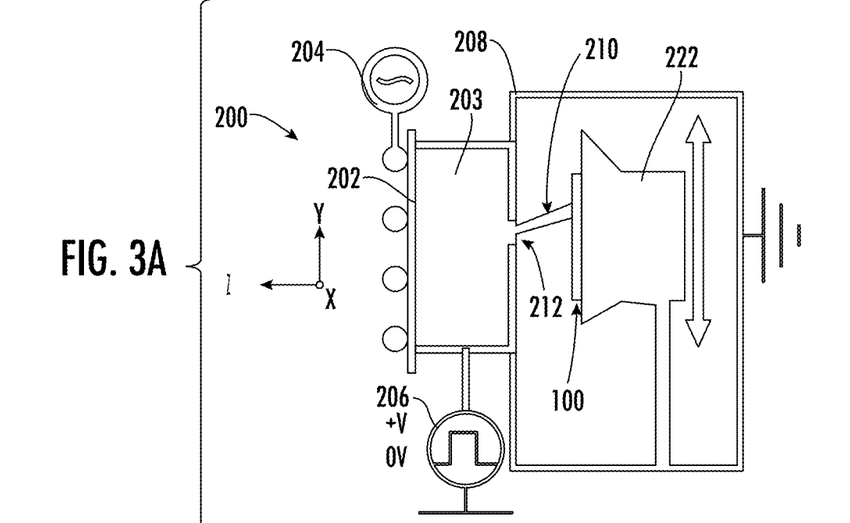
FIG. 3A shows a side view of an apparatus according to embodiments of the disclosure.

While the present embodiments cover any suitable ion source to provide an angled reactive beam for selectively forming a seed layer, according to various embodiments of the disclosure a reactive beam may be formed from a compact plasma source. FIG. 3A shows a side view of an apparatus 200, according to embodiments of the disclosure. In this example, the apparatus 200 includes a plasma chamber 202, powered by a power source 204, which power source may be an RF source or other suitable power source. Various gas sources (not shown) may be employed to supply a suitable (set of) gas to generate a reactive beam of the appropriate composition. In some examples, reactive gases based upon fluorides and/or chlorides of a metal layer to be deposited are used. For example, a tungsten hexafluoride gas may be provided to the plasma chamber 202 to generate a reactive beam that contains tungsten. In another example, but another example could be titanium tetrachloride may be used as a gas (together with ammonia or nitrogen gas) that is supplied to plasma chamber 202 to generate a reactive beam for TiN deposition of a seed layer. In still other examples, organometallics may be used for plasma enhanced ALD processes to generate a metallic seed layer.

When a plasma 203 is generated in the plasma chamber 202, a reactive beam 210 may be extracted from the plasma 203 through an extraction aperture 212 that is arranged along one side of the plasma chamber 202, and the reactive beam 210 may be directed to the substrate 100. Various types of extraction assembly may be employed to extract the reactive beam 210, with examples shown in the figures to follow.

Generally, an extraction assembly will be designed to extract the reactive beam 210 at a non-zero angle of incidence with respect to perpendicular to the plane 114 of the substrate 100. The reactive beam 210 may include radicals, energetic radicals, and energetic neutrals that tend to stream out of the plasma chamber 202 in a directional manner that defines the non-zero angle of incidence. As well as neutral species, the reactive beam 210 may include reactive ions. In some embodiments, an extraction voltage supply 206 may be employed to apply a bias voltage between the plasma chamber 202 and the substrate 100, in order to impart a specific ion energy to ions of the reactive beam 210. For example, an extraction voltage of 300 eV applied between the plasma chamber 202 and the process chamber 208 that contains a platen 222, holding the substrate 100 (assuming that the substrate 100 is biased to the same potential as the process chamber 208) will generate a reactive beam 210 having ions characterized by an ion energy slightly in excess of 300 eV. In particular non-limiting embodiments, ions of the reactive beam 210 may be directed at an energy of 500 eV or less, 300 eV or less, or 100 eV or less. In some embodiments, the reactive beam 210 may include ions that are directed at an energy of 10 eV to 100 eV. The present inventors have found that excessive energy above, for example, 500 eV, may cause excess sputtering and material redistribution, as discussed above. In particular, attempts at deposition of a seed layer of tungsten at 700 eV has shown substantially resputtering of seed layer material as well as surface feature material. Depending upon the exact ion species of reactive beam 210, an energy below approximately 200 eV, or 100 eV may generate minimal sputtering of substrate 100 or minimal resputtering of depositing material from reactive beam 210, leading to a controlled placement of depositing material, as shown in FIGS. 2A-2C. In some embodiments, no extraction voltage may be applied between the plasma chamber 202 and the process chamber 208. In such circumstances, when the plasma chamber 202 and the process chamber 208 are held at the same potential (e.g., ground potential), the reactive beam 210 will be extracted at an ion energy equal to the plasma potential in the plasma chamber, often in the range of 10 eV to 40 eV, depending upon the ion species, plasma density, and so forth. At ion energy in this range, any ions of the reactive beam 210 may be directed with sufficient collimation and sufficient energy to help deposit a selective seed layer, where resputtering is minimal or non-existent.

Figure 3B:
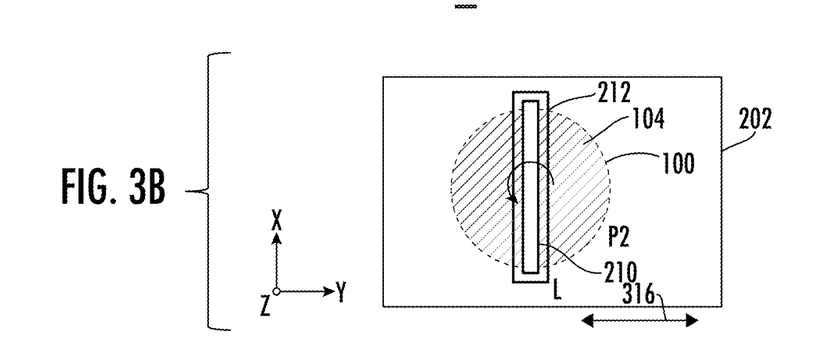
FIG. 3B shows a top plan view of a variant of the apparatus of FIG. 3A.

FIG. 3B shows a top plan view of a variant of the apparatus 200 of FIG. 3A. In this variant the extraction aperture is elongated along the x-direction, to generate a ribbon-shaped ion beam for reactive beam 210. This shape of an ion beam (e.g., a ribbon beam) may have an elongated cross-section to cover an entirety of a substrate 100, such as a silicon wafer, along the x-direction, so that scanning of the substrate 100 along the Y-direction (see scanning direction 316) may effectively expose the entirety of the substrate 100 to the reactive beam 210.

Figure 4:
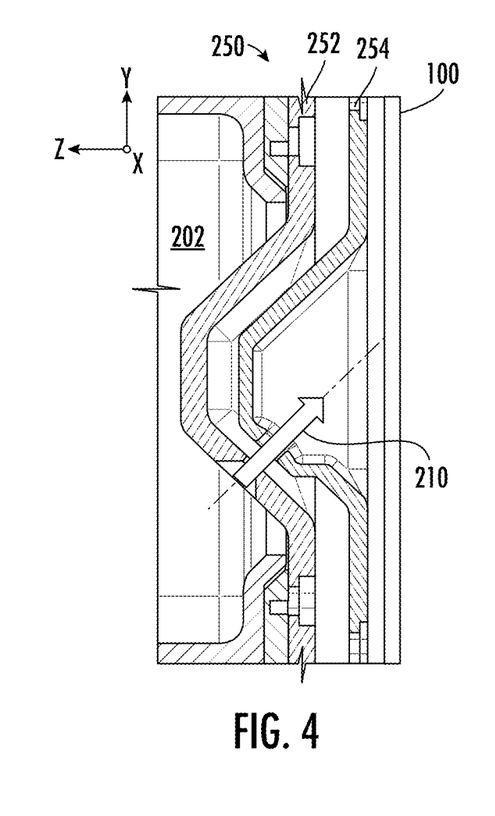
FIG. 4 shows a side view of another apparatus according to embodiments of the disclosure.

FIG. 4 shows a side view of another apparatus according to embodiments of the disclosure. The view in FIG. 4 shows a cross-section of an extraction assembly 250, coupled to the plasma chamber 202, and including a first extraction plate 252 and a second extraction plate 254. As shown in FIG. 4, the first extraction plate 252 and a second extraction plate 254 are arranged to include an angled recess, where one edge of the angled recess include an extraction aperture that is angled with respect to the substrate 100 to extract an ion beam at a fixed, non-zero angle of incidence with respect to a perpendicular to a plane of the substrate 100. Extraction of an ion beam may proceed as discussed with respect to FIG. 3, where a bias voltage may or may not be applied between the plasma chamber 202 and substrate 100, depending upon the targeted ion energy. Such a configuration may be suitable to deposit a selective seed layer on a substrate when the geometry of the substrate features is uniform, for example. Thus, the extraction assembly 250 may be set to generate a 45 degree angle of incidence, a 30 degree angle of incidence, a 60 degree angle of incidence, and so forth.

Figure 5:
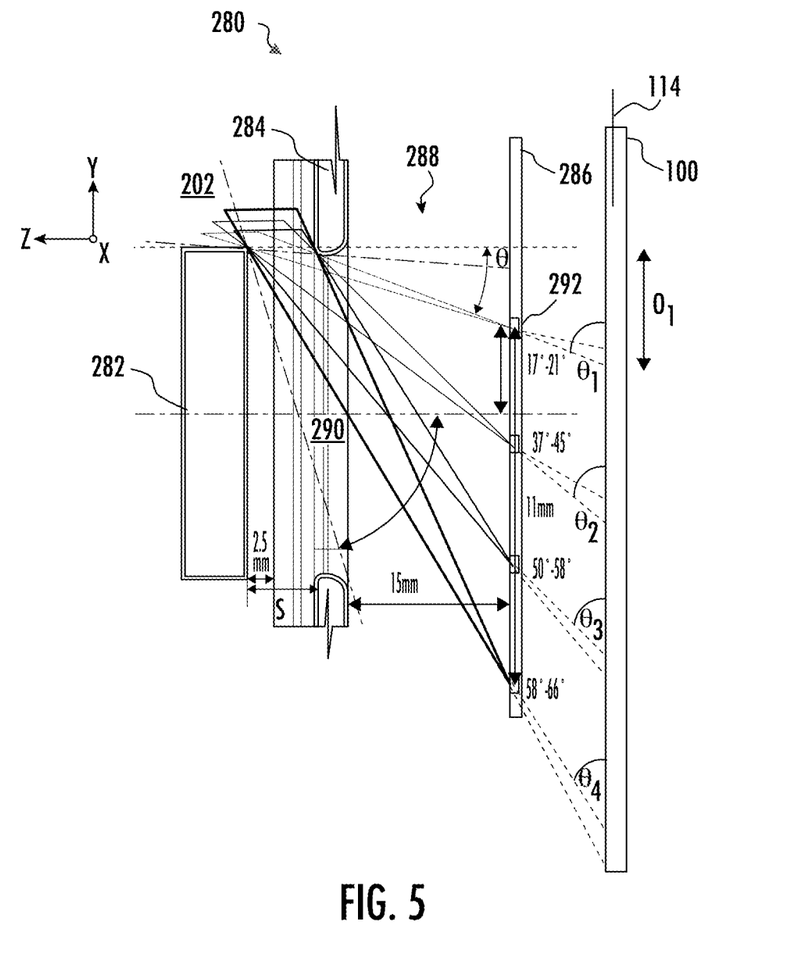
FIG. 5 shows a side view of a further apparatus according to embodiments of the disclosure.

FIG. 5 shows a side view of another apparatus according to embodiments of the disclosure. The view in FIG. 5 shows a cross-section of an extraction assembly 250, coupled to the plasma chamber 202, and including an extraction plate 284 and a beam blocker 282. The extraction assembly 280 may further include a collimation plate 286, disposed between the extraction plate 284 and substrate 100. Extraction of an ion beam may proceed as discussed with respect to FIG. 3, where a bias voltage may or may not be applied between the plasma chamber 202 and substrate 100, depending upon the targeted ion energy. To generate an angled ion beam, the beam blocker 282 may be arranged to block a portion of the aperture 290, formed with the extraction plate 284, so that an ion beam 288 is extracted from the plasma chamber 202 along the edge of the aperture 290 as shown.

Notably, ions may exit the plasma chamber 202 over a range of angles. To select for a given angle of incidence (or narrow range of angles of incidence) ($\theta$), the collimation plate 286 may be provided with a collimation aperture 292 arranged at a specific offset O with respect to an edge of the aperture 290. In some embodiments, the aperture 290 and collimation aperture 292 may be elongated along the X-axis to as to generate a ribbon beam shape for the ion beam 288. FIG. 5 illustrates four possible placements for the collimation aperture 292. Increasing the value of O will lead to a higher value of $\theta$. In FIG. 5, for an offset O1, the corresponding q1 is 17-21 degrees. Larger offsets will produce larger angles of incidence. Thus, for a given placement of the collimation aperture 292, ions exiting the plasma chamber 202 will be blocked from traversing to the substrate 100, except those ions having the suitable angle of incidence to pass through the collimation aperture 292 and strike the substrate 100. Thus, by switching between different collimation plates having different value of O, the apparatus of FIG. 5 presents a convenient means to vary the angle of incidence of ions of a reactive beam to be applied to a substrate to change the coverage of a selective seed layer on surface features 104, as generally shown in FIGS. 2A-2C.

EXAMPLES

W/10 nm Tox/Si Pillars

Figure 6A:
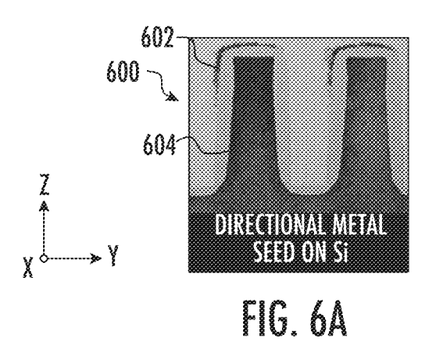
FIGS. 6A-6C are electron microscopy images showing one example of selective deposition on a device structure at various instances, according to an embodiment of the disclosure.
Figure 6B:
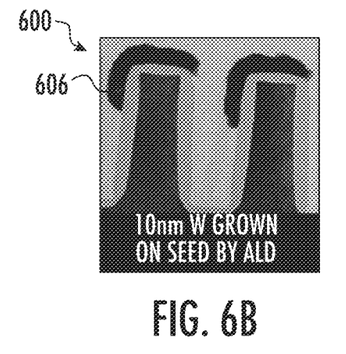
Figure 6C:
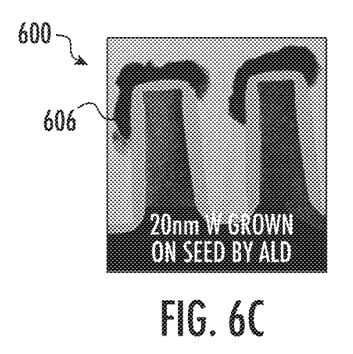

FIGS. 6A-6C are cross-sectional electron microscopy images showing one example of selective deposition on a device structure at various instances, according to an embodiment of the disclosure. The device structure 600 of FIG. 6A includes surface features formed from silicon In FIG. 6A there is shown the result of angled reactive beam deposition of a seed layer of tungsten metal using extraction of ions from a plasma formed from mixing metallic fluorides with hydrogen and argon. The seed layer 602 has formed to a thickness of approximately 3 nm as shown (controlled by the chosen deposition time). The geometry of the reactive beam is such that the seed layer 602 is caused to form over the entire top surface of surface features 604, as well as a portion of the left sidewall of surface feature 604.

Turning to FIG. 6B, there is shown a subsequent instance where an ALD process as been performed to expose the surface features 604 in an isotropic manner to condensing species formed using a metal-fluoride precursor and hydrogen as a reactant. A tungsten layer 606 having an average thickness of 10 nm has selectively formed over the portion of surface features 604 where the seed layer 602 was previously formed. The tungsten layer 606 has not formed over other portions of the surface features 604.

Turning to FIG. 6C, there is shown a subsequent instance where the ALD process of FIG. 6B has been continued to expose the surface features 604 to further growth under the same conditions as FIG. 6B. The tungsten layer 606 now has an average thickness of 20 nm and is selectively formed over the portion of surface features 604 where the seed layer 602 was previously formed. The tungsten layer 606 has still not formed over other portions of the surface features 604.

W/SiO$_2$ (Pillars)/TiN (Base Surface)

Figure 7A:
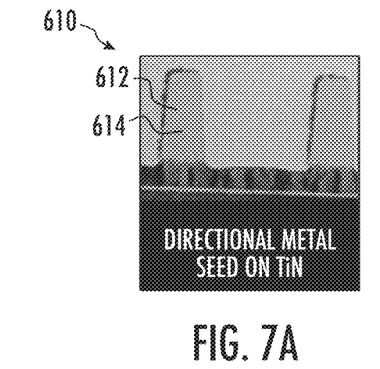
FIGS. 7A-7C are electron microscopy images showing another example of selective deposition on a device structure at various instances, according to another embodiment of the disclosure.
Figure 7B:
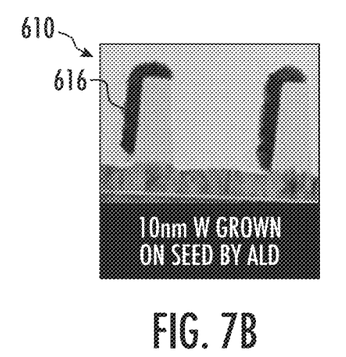
Figure 7C:
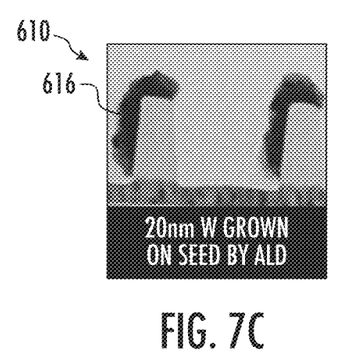

FIGS. 7A-7C are cross-sectional electron microscopy images showing another example of selective deposition on a device structure at various instances, according to an embodiment of the disclosure. The device structure 610 of FIG. 7A includes surface features 614 formed from silicon oxide pillars disposed over a layer of titanium nitride In FIG. 7A there is shown the result of angled reactive beam deposition of a seed layer of tungsten metal using extraction of ions from a plasma formed from mixing metallic fluorides with hydrogen and argon. The seed layer 612 has formed to a thickness of 3 nm as shown. The geometry of the reactive beam is such that the seed layer 612 is caused to form over the entire top surface of surface features 604, as well as nearly all of the left sidewall of surface feature 614.

Turning to FIG. 7B, there is shown a subsequent instance where an ALD process has been performed to expose the surface features 614 in an isotropic manner to condensing species formed a metal-fluoride precursor and hydrogen as a reactant. A tungsten layer 616 having an average thickness of 10 nm has selectively formed over the portion of surface features 614 where the seed layer 612 was previously formed. The tungsten layer 616 has not formed over other portions of the surface features 614.

Turning to FIG. 7C, there is shown a subsequent instance where the ALD process of FIG. 7B has been continued to expose the surface features 614 to further growth under the same conditions as FIG. 7B. The tungsten layer 616 now has an average thickness of 20 nm and is selectively formed over the portion of surface features 614 where the seed layer 602 was previously formed. The tungsten layer 616 has still not formed over other portions of the surface features 614.

W/SiO$_2$ (Pillars)/TiN (Base Surface)

Figure 8A:
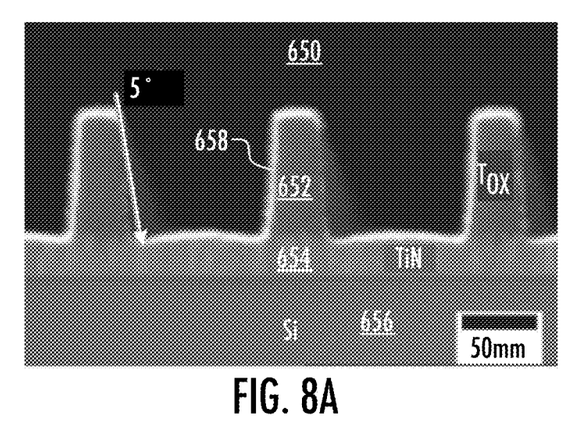
FIGS. 8A-8D are cross-sectional electron microscopy images showing another example of directional reactive deposition of a seed layer as a function of angle of incidence, according to embodiments of the disclosure.
Figure 8B:
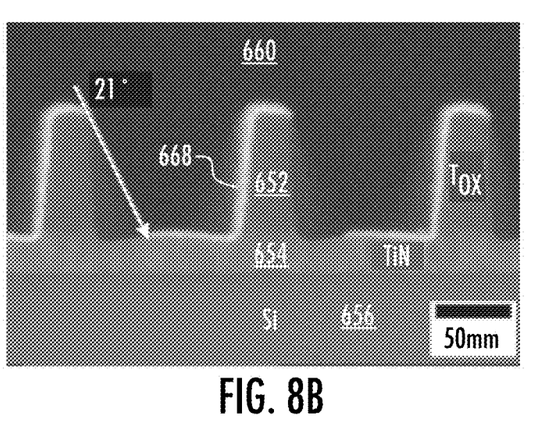
Figure 8C:
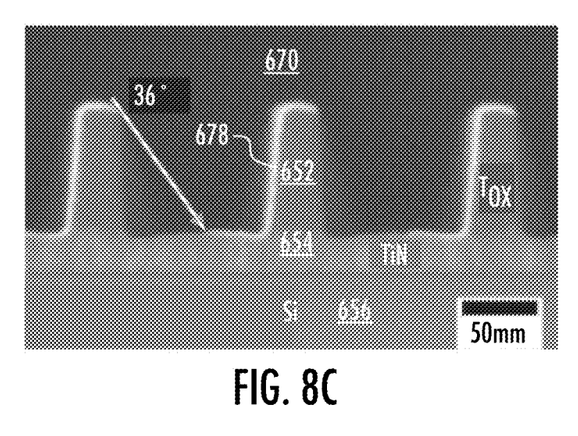
Figure 8D:
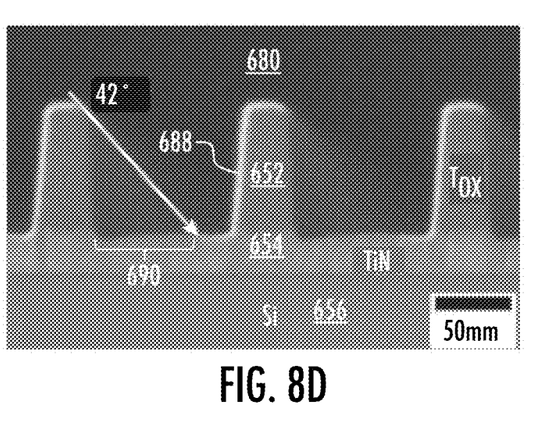

FIGS. 8A-8D are cross-sectional electron microscopy images showing another example of directional reactive deposition of a seed layer using a tungsten-containing reactive ion beam. The results are shown after deposition of a ~5 nm-10 nm seed layer, where the angle of incidence of the reactive beam (with respect to perpendicular to the substrate plane) is varied between figures. In this example, a selective seed layer was deposited using an apparatus similar to the apparatus shown in FIG. 5, where extraction of a single reactive beam takes place through an extraction assembly similar to extraction assembly 280. The substrate structures shown are based upon a silicon substrate 656, a TiN base layer 654, and silicon oxide surface features 652. The device structure 650, device structure 660, device structure 670, and device structure 680 are formed by depositing a seed layer at a 5 degree angle of incidence, a 21 degree angle of incidence, a 36 degree angle of incidence, and a 42 degree angle of incidence, respectively. As shown in FIG. 8A, the seed layer 658, formed at the steepest angle, covers the top surface, left sidewall of silicon oxide surface features 652, and extends nearly all the way between adjacent surface features on the TiN base layer 654. As shown in FIG. 8B, the seed layer 668, formed at 21 degrees, covers the top surface, left sidewall of silicon oxide surface features 652, and extends more than half of the way between adjacent surface features on the TiN base layer 654. As shown in FIG. 8C, the seed layer 678, formed at 36 degrees, covers the top surface, left sidewall of silicon oxide surface features 652, and extends less than half of the way between adjacent surface features on the TiN base layer 654. As shown in FIG. 8D, the seed layer 688, formed at 426 degrees, covers the top surface, left sidewall of silicon oxide surface features 652, and extends very little over the surface of the TiN base layer 654. These results are explained by the shadowing effect of each adjacent surface feature, for ions of a given angle of incidence, indicated by the arrows. As shown, the extent of the coverage of seed layer on the TiN base layer 654 is nearly exactly at the position where the "shadow" cast by a given surface feature for a given angle of incidence ends (see shadow region 690 of FIG. 8D). Thus, the control of the angle of incidence may be used to precisely locate a seed layer using the directional reactive beam processing of the present embodiments.

Figure 9A:
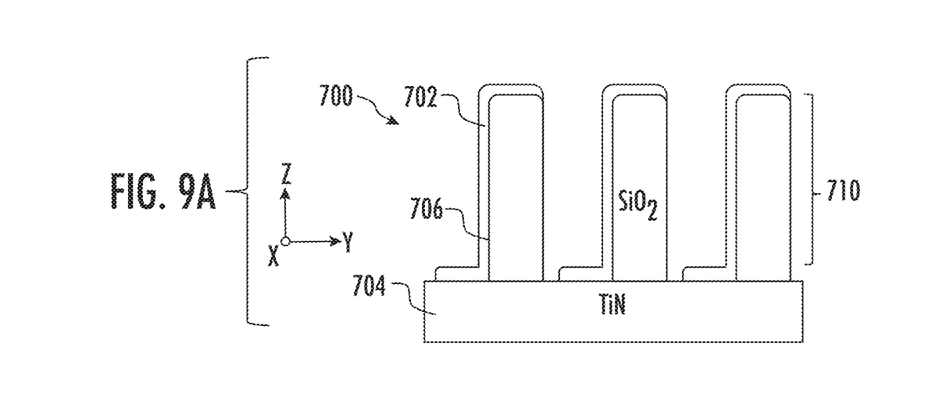
FIG. 9A shows a schematic side view of a device structure after selective deposition to form an S-shaped deposit layer, in accordance with an embodiment of the disclosure.
Figure 9B:
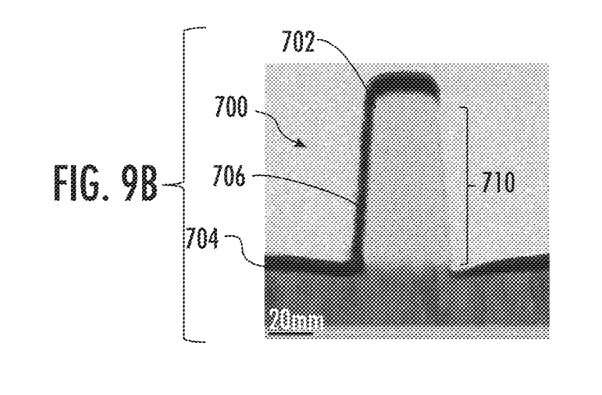
FIG. 9B is an electron micrograph that shows a side view of a device structure after selective deposition to form an S-shaped deposit layer, in accordance with an embodiment of the disclosure.

In accordance with embodiments of the disclosure, a directional reactive beam process may be combined with an ALD or CVD process to selectively form a staggered or S-shaped deposit layer on a plurality of surface features. FIG. 9A and FIG. 9B shows a schematic side view and an electron micrograph in side view, respectively, a of a device structure 700 after selective deposition to form an S-shaped deposit layer 702, in accordance with an embodiment of the disclosure. The S-shaped deposit layer 702 is formed on surface features 710, made of silicon oxide, and disposed over a TiN base layer 704. In the example of FIG. 9B, the S-shaped deposit layer 702 is formed using a directional, angled reactive beam, generally as described with respect to FIG. 1B (or with respect to FIG. 2C), for example. Said differently, the S-shaped deposit layer 702 of FIG. 9B corresponds to just the seed layer 112 or more particularly seed layer 112-C, while no separate deposit layer has been formed on top of the seed layer. However, in some embodiments, an S-shaped contact layer may be formed with a combination of directional reactive beam deposition of a seed layer in combination with ALD or CVD as generally discussed with respect to FIG. 2C. In this example, the angle of the directional reactive beam is steep enough so as to generate an S-shaped pattern of a seed layer that extends on top surfaces of the surface features 710, along the left sidewalls 706, and on the surfaces between adjacent surface features. In FIG. 9B, selective deposition of a metal layer to a thickness of 5 nm to 8 nm has taken place.

According to various embodiments of the disclosure, an S-shaped contact may be incorporated into an electronic device to provide improved connectivity between device structures that are located in different levels of the device.

Figure 10A:
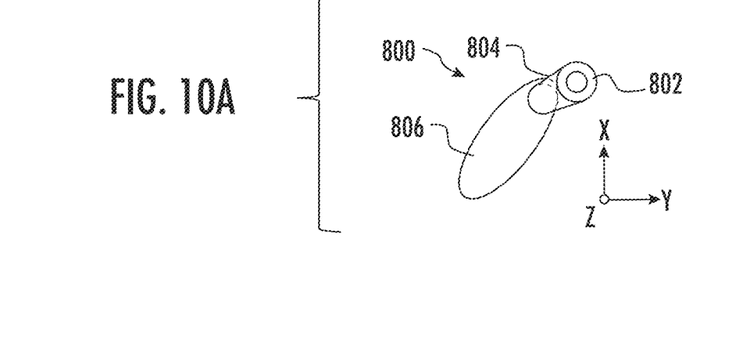
FIG. 10A is a top plan view of a device structure, incorporating an S-shaped contact, in accordance with an embodiment of the disclosure.
Figure 10B:
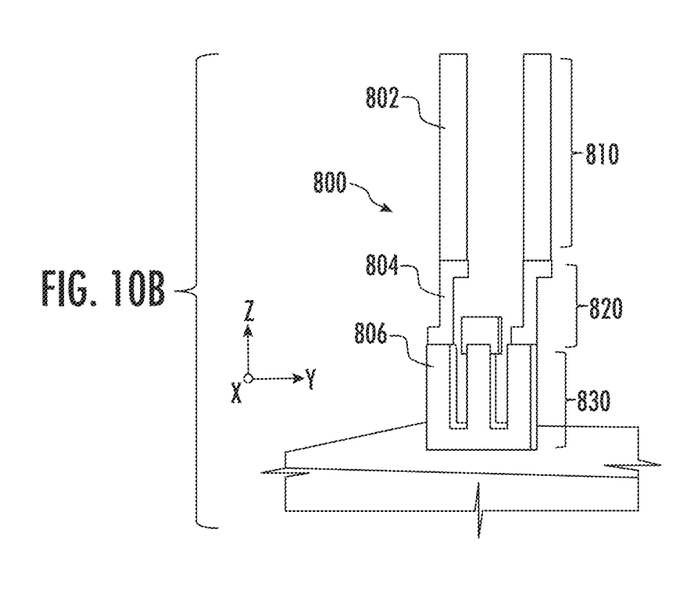
FIG. 10B is a side view of a device structure having an S-shaped contact, according to an embodiment of the disclosure.

FIG. 10A is a top plan view of a device structure 800, incorporating an S-shaped contact, in accordance with an embodiment of the disclosure. FIG. 10B is a side view of the device structure 800 of FIG. 10A, according to an embodiment of the disclosure. This embodiment illustrates the ability of an S-shaped contact to form a multi-level device contact in order to electrically connect device features that are disposed in different device levels and are staggered from one another within a plane of the substrate.

The device structure 800 illustrates several components of a memory device, such as a DRAM device. The device structure 800 includes an array of device features, specifically a set of storage capacitors, shown as storage capacitors 802, arranged in a storage capacitor level, shown as level 810. As used herein, a "level" may refer to a portion of a device, where different levels are built one upon another as a device is fabricated, such as by using a different masking operation for a different level. A "substrate plane" as used herein may refer to the X-Y plane of the Cartesian coordinate system shown. During fabrication of a device, the different levels are generally sequentially built upon one another proceeding along the Z-axis. Thus, a lower level may be built generally lower on the Z-axis, while a higher level may be built higher along the Z-axis, as shown in FIG. 10B. Notably, different structures constructed from different mask levels may reside or overlap in the same physical level along the Z-axis, as known in the art.

The device structure 800 further includes an active device region 806, where the active device region 806 is disposed in an active device level, shown as level 830. The active device region 806 may represent an upper surface of a semiconductor structure, such as a transistor features, including monocrystalline silicon, to serve as an active transistor component, such as a source/drain (S/D) structure of a transistor. As such, the active device region may constitute an array of active device features. The device structure 800 further includes a set of contacts, shown as S-shaped contacts 804, where a given S-shaped contact extends in a contact via level 820 between a storage capacitor 802 and the active device region 806. In the example of FIG. 10A and FIG. 10B, two storage capacitors are shown, where a storage capacitor 802 is connected to either a source region or a drain region of the active device region 806. Notably, the two storage capacitors shown may contact two different transistors, formed using the active device region 806.

The S-shaped contacts may be formed of an electrically conductive material to form an electrically conductive path between the active device region 806 and storage capacitor 802. As shown in FIG. 10A and FIG. 10B, a given capacitor or an array of capacitors, may be offset so that the storage capacitor 802 does not overlap the active device region 806 within the substrate plane (X-Y plane). At the same time, the active device region 806 and the storage capacitor 802 may be suitably electrically connected to one another because of the stagger in the S-shaped contact 804. The top of the S-shaped contact 804, may, for example, provide a complete overlap with the bottom of the storage capacitor 802, while the bottom of the S-shaped contact 804 completely overlaps the active device region 806.

Figure 11:
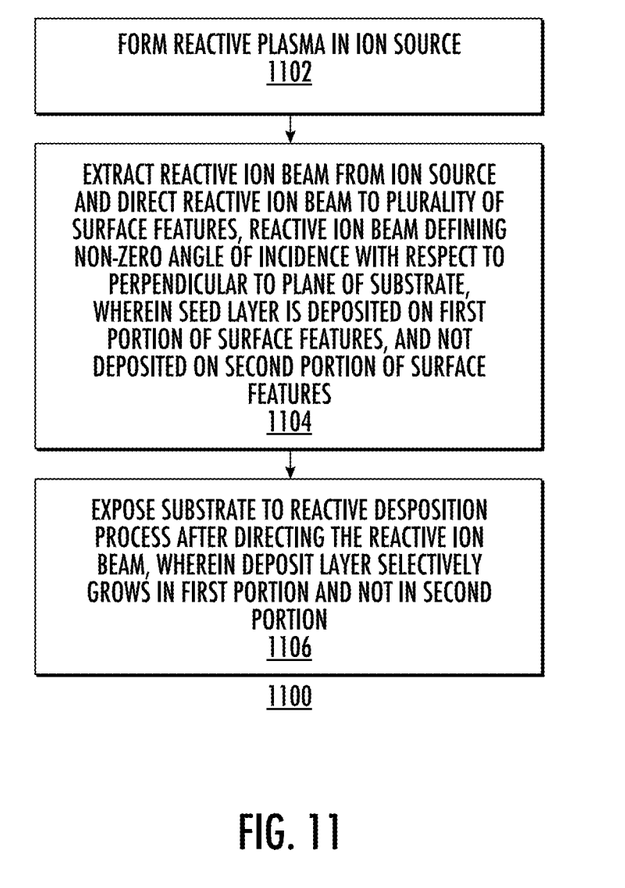
FIG. 11 shows an exemplary process flow, according to further embodiments of the disclosure.

FIG. 11 shows an exemplary process flow 1100, according to further embodiments of the disclosure. At block 1102, a reactive plasma is formed in an ion source. The ion source may be any suitable ion source, including the embodiments disclosed herein, such as in FIGS. 2-5.

At block 1104, a reactive beam is extracted from the ion source, and is directed to a plurality of surface features, where the surface features may extend above a base of a substrate. The reactive beam may define a non-zero angle of incidence with respect to a perpendicular to a plane of the substrate. As such, a seed layer is deposited on a first portion of the surface features, and is not deposited on a second portion of surface features. The seed layer may be deposited to a determined thickness such as 5 nm, 2 nm, or 1 nm in some non-limiting embodiments.

At block 1106, the substrate is exposed to a reactive deposition process after the reactive beam is directed to the substrate to form the seed layer, wherein a deposit layer selectively grows in the first portion and not in the second portion of the substrate. The deposit layer may be deposited to a determined thickness such as 5 nm, 10 nm, or 20 nm in some non-limiting embodiments. In some embodiments, the deposit layer may be a metallic material. Suitable shapes of deposit layer include an L-shape and an S-Shape in some non-limiting embodiments. In particular embodiments, the deposit layer may be used to form an S-shaped contact to electrically connect device features that are disposed in different device levels and are staggered from one another within a plane of the substrate.

The present embodiments provide various advantages over known approaches for selective deposition. A first advantage is the precise angular control of seed layer and overlayer depositions using angled ion beams. A further advantage is the ability to perform metal line patterning in the tightly spaced arrays of features. A further advantage is the seed layer generated by the reactive beam requires no adhesive layer needed for metal nucleation using other techniques. Said differently, the formation of a selectively deposited metal seed layer according to the present embodiments is independent of the underlying layer/film due to the PECVD metal deposition process. A further advantage is that a bulk deposit may be selectively formed in targeted areas of surface features, in conjunction with a chemically non-selective seed layer process. Yet another advantage of the present embodiments is the ability to create novel connecting structures, such as S-shaped vias and S-shaped contacts, to couple different structures together that are not aligned with one another in different levels. A further advantage is the ability to improve contact resistance between misaligned structures because of the lateral shift provided by an S-shaped contact.

The present disclosure is not to be limited in scope by the specific embodiments described herein. Indeed, other various embodiments of and modifications to the present disclosure, in addition to those embodiments described herein, will be apparent to those of ordinary skill in the art from the foregoing description and accompanying drawings. Thus, such other embodiments and modifications are in the tended to fall within the scope of the present disclosure. Furthermore, the present disclosure has been described herein in the context of a particular implementation in a particular environment for a particular purpose, while those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method of forming multi-level device contact, comprising:
providing a substrate, the substrate defining a plane of the substrate and having an array of spacer features, disposed over an array of active device features, arranged in a first level; and
directing a reactive beam to the array of spacer features, the reactive beam defining a non-zero angle of incidence with respect to a perpendicular to the plane of the substrate, wherein a seed layer is deposited on a first portion of the array of spacer features, and is not deposited on a second portion of the array of spacer features,
wherein the reactive beam comprises a metallic species, and wherein the seed layer forms an array of staggered contacts, having an S-shape.

2. The method of claim 1, wherein the seed layer comprises a metallic material.

3. The method of claim 1, further comprising exposing the substrate to a reactive deposition process after the directing the reactive beam, wherein an S-shaped deposit layer is formed on the seed layer, wherein the array of staggered contacts includes the seed layer and the S-shaped deposit layer.

4. The method of claim 3, wherein the S-shaped deposit layer is formed by a chemical vapor deposition process or an atomic layer deposition process.

5. The method of claim 3, wherein the seed layer and the S-shaped deposit layer comprise are a same material.

6. The method of claim 3, wherein the reactive deposition process is a non-directional deposition process.

7. The method of claim 3, wherein the substrate comprising a DRAM device, a NAND device, a 3D NAND device, a NOR device, an X point memory, or a logic device.

8. The method of claim 1, wherein a thickness of the seed layer is between 1 nm and 10 nm.

9. The method of claim 1, wherein an ion energy of the reactive beam is between 10 eV and 400 eV.

10. The method of claim 1, further comprising: heating the substrate to generate a substrate temperature between 100 C and 500 C during the directing the reactive beam.

11. The method of claim 1, further comprising: forming an array of device structures, disposed in a second level, wherein the array of staggered contacts electrically conductively connect the array of active device features with the array of device structures.

12. The method of claim 1, wherein the non-zero angle of incidence is between 5 degrees and 85 degrees.

13. The method of claim 1, wherein a thickness of the seed layer is between 1 nm and 10 nm, wherein an ion energy of the reactive beam is between 10 eV and 400 eV, and wherein a substrate temperature is between 100 C and 1000 C during the directing the reactive ion beam.

* * * * *